United States Patent [19]

Speckbacher et al.

[11] Patent Number: 5,786,931
[45] Date of Patent: Jul. 28, 1998

[54] PHASE GRATING AND METHOD OF PRODUCING PHASE GRATING

[75] Inventors: Peter Speckbacher, Kirchweidach; Georg Flatscher, Schneizlreuth; Michael Allgäuer, Stein; Erich Bayer, Trostberg; Erwin Spanner, Traunstein; Andreas Franz, Trostberg, all of Germany

[73] Assignee: Johannes Heidenhain GmbH, Traunreut, Germany

[21] Appl. No.: 629,379

[22] Filed: Apr. 8, 1996

[30] Foreign Application Priority Data

Apr. 13, 1995 [EP] European Pat. Off. ............ 95105584

[51] Int. Cl.⁶ .................. G02B 5/18; G02B 27/44; G03H 1/04
[52] U.S. Cl. .............. 359/572; 359/566; 359/569; 359/900; 430/1; 430/2
[58] Field of Search ................ 359/569, 571, 359/572, 575, 576; 430/321, 320, 1

[56] References Cited

U.S. PATENT DOCUMENTS

| | | |
|---|---|---|
| 4,360,586 | 11/1982 | Flanders et al. . |
| 4,708,437 | 11/1987 | Kraus . |
| 4,828,356 | 5/1989 | Hobrock et al. ............... 359/572 |
| 4,846,552 | 7/1989 | Veldkamp et al. . |
| 5,021,649 | 6/1991 | Nishimura et al. . |
| 5,245,471 | 9/1993 | Iwatsuka et al. . |
| 5,377,044 | 12/1994 | Tomono et al. ............... 359/572 |

FOREIGN PATENT DOCUMENTS

| | | |
|---|---|---|
| 0 020 132 A | 12/1980 | European Pat. Off. . |
| 0 160 784 4 | 11/1985 | European Pat. Off. . |
| 0 387 520 A | 9/1990 | European Pat. Off. . |
| 0 390 092 B | 10/1990 | European Pat. Off. . |
| A 1 781 657 | 2/1994 | Russian Federation . |

*Primary Examiner*—Paul M. Dzierzynski
*Assistant Examiner*—Audrey Chang
*Attorney, Agent, or Firm*—Brinks Hofer Gilson & Lione

[57] ABSTRACT

The phase grating of the present invention includes a substrate with a reflective, continuous layer disposed thereon on which a structured spacer layer 3 of dielectric material is applied. To form a phase grating that can be used as a scale in photoelectric position measuring instruments, a further thin reflective surface layer is located solely on the reflective, continuous surfaces, parallel to the layer, of the structured spacer layer.

11 Claims, 1 Drawing Sheet

1

PHASE GRATING AND METHOD OF PRODUCING PHASE GRATING

FIELD OF THE INVENTION

The present invention relates to a phase grating for a photoelectric position measuring instrument and more particularly to a phase grating and the method for producing a phase grating.

A phase grating is used in photoelectric position measuring instruments as a material measure for measuring the relative location of two objects movable relative to one another.

U.S. Pat. No. 4,708,437 discloses a phase grating that includes two spaced-apart reflection layers that are disposed on both sides of a transparent spacer layer; wherein at least one reflection layer is embodied as an amplitude grating. In all the exemplary embodiments, the spacer layer is embodied as a uniformly thick transparent layer that is continuous over the entire surface. While such a phase grating is simple and economical to make, it has been found that when used as a diffraction grating in a photoelectric position measuring instrument, its diffraction properties are not especially good.

The phase grating disclosed in U.S. Pat. No. 5,021,649, in which a reflective layer is applied over the entire surface to a release grating, has no homogeneous diffraction properties over the measurement length and cannot be made in a reproducible way.

U.S. Pat. No. 4,360,586 discloses a mask for producing a diffraction grating. The mask used for the exposure to light is operated in transmitted light and is coated over its entire surface with aluminum.

SUMMARY OF THE INVENTION

According to a first aspect of the present invention there is provided phase grating for a photoelectric position measuring instrument having a substrate, a first reflective layer disposed over an entire surface of the substrate, a transparent spacer layer disposed on the first reflective layer and a second reflective layer disposed on the spacer layer. The second reflective layer is spaced apart from and extends parallel with the first reflective layer and forms an amplitude grating wherein the spacer layer is provided solely between the first and second reflective layer. The spacer layer forms lands which have edges extending perpendicularly to the first and second reflective layers wherein the index of refraction is different on either side of the edges.

According to a second aspect of the present invention a method for producing a phase granting is provided. The method includes the steps of depositing a first continuous reflection layer onto a substrate, depositing a uniformly thick spacer layer over the entire surface of the first continuous reflection layer, depositing a uniformly thick second reflection layer over the entire surface of the spacer layer, depositing a resist layer on the reflection layer, placing a mask over the resist layer and exposing the unmasked regions of the resist layer to light and etching away the unmasked regions of the resist layer, etching away the second reflection layer not coated with the resist layer, etching away the spacer layer in the regions not coated with the second reflective layer, and removing the resist layer.

An object of the present invention is a phase grating of a position measuring instrument that permits simple manufacture and has good optical properties.

The advantages attained by the present invention are particularly that only relatively thin reflection layers need to be structured dimensionally accurately, but the step depth remains unaffected by the structuring process. In the phase grating of the present invention, small division periods can be realized with simple means, and the phase grating has good diffraction properties and high efficiency.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENTS

Figure 1:
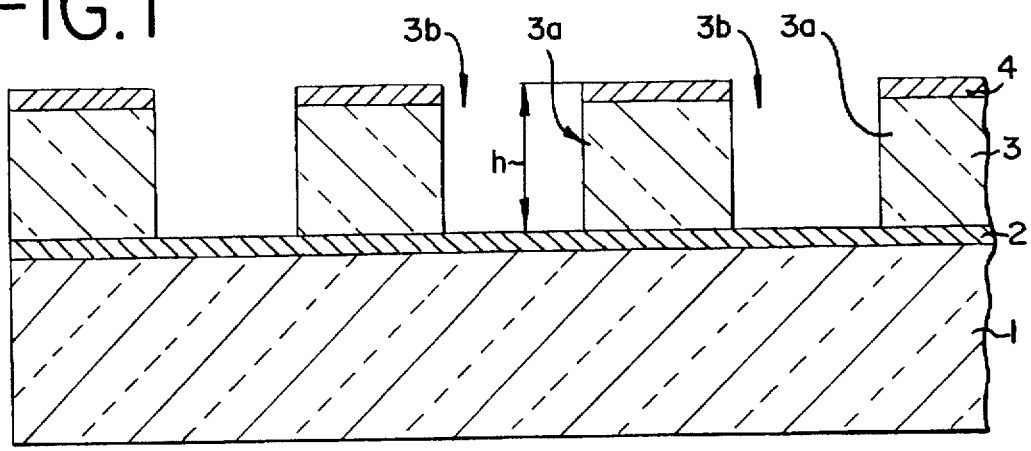
FIG. 1 is a cross-sectional view of a phase grating according to a preferred embodiment of the invention.

FIG. 1 is a cross-sectional view of a phase grating according to a preferred embodiment of the present invention. The phase grating shown in FIG. 1 has the following layer construction. A nonstructured highly reflective thin layer 2 is disposed on a substrate 1. The substrate 1 represents the measuring scale of a length measuring instrument. Since the substrate 1 represents the measuring scale of a length measuring instrument, it is advantageous if the substrate is made of a material of high stability, preferably such as quartz, ZERODUR, which is available from the Schott corporation or steel. ZERODUR has the advantage that the length of the measuring scale varies only slightly in response to temperature changes. As a reflective layer 2, preferably chromium or gold with a layer thickness of preferably approximately 30 nm is especially suitable, but a thin titanium layer or multiple layers of dielectrics may also be used.

A transparent spacer layer 3 forms the phase-shifting layer that is preferably approximately 50 to 200 nm thick. The spacer layer 3 is not continuous but instead is structured, i.e. it has lands 3a and gaps 3b. As the material for this layer 3, preferably a dielectric material such as silicon dioxide ($SiO_2$), titanium dioxide ($TiO_2$), tantalum pentoxide ($Ta_2O_5$) and aluminum oxide ($Al_2O_3$) is especially suitable. A reflective surface layer 4 of chromium is applied in a thickness preferably of approximately 10 to 100 nm on the lands of the spacing layer 3 as shown.

If a beam of light strikes the phase grating, partial beams are then reflected both at the surfaces of the lands and at the surfaces of the gaps located at a greater depth between the lands.

The phase displacement between the reflecting partial beams depends on the wavelength $\lambda$ of the incident beam and on the step height h of the lands. The step height h is determined by the thickness of the transparent spacer layer 3 and of the reflective surface layer 4. A typical value for the desired phase displacement is $\lambda/2$. For example, for a phase grating located in air, a step height h of $(2k-1)\lambda/4$ results, where k=1, 2, 3 . . . Typically, k=1 is chosen.

Figure 2A:
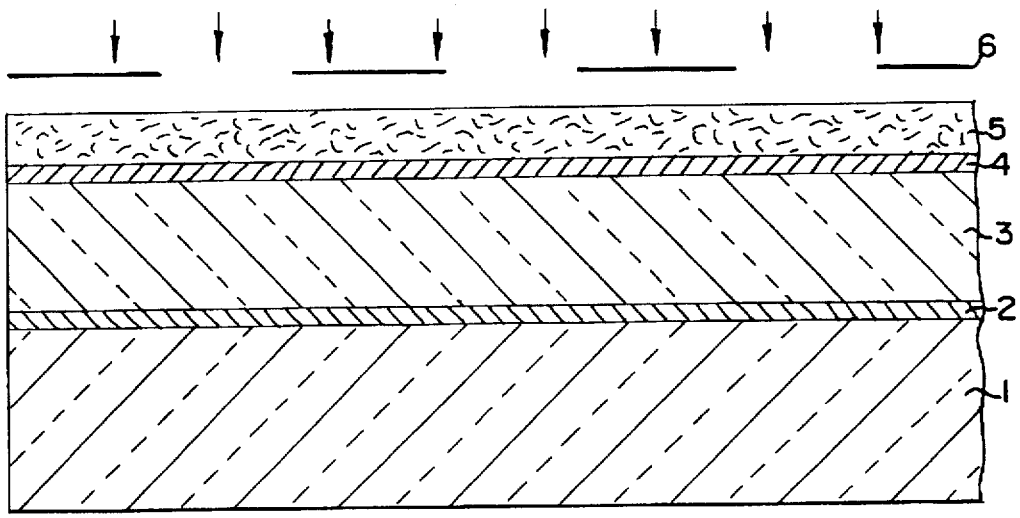
FIGS. 2a–b present process steps used in making the phase grating shown in FIG. 1.
Figure 2B:
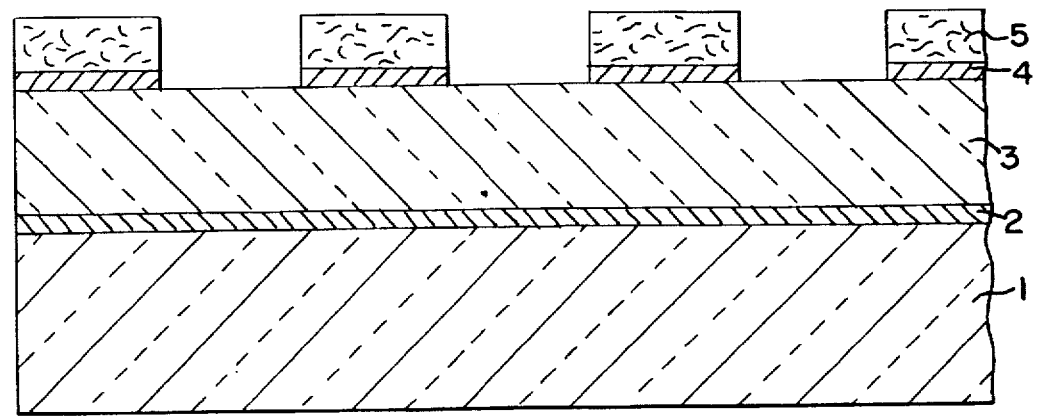

FIGS. 2a–b illustrate the process steps used in making the phase grating shown in FIG. 1. As shown in FIGS. 2a and 2b, only a few, simple process steps are necessary for making the phase grating shown in FIG. 1. In FIG. 2a, the substrate 1 is shown along with the lowermost, continuous reflection layer 2 disposed thereon, the transparent spacer layer 3 disposed on the reflection layer 2, and the reflective surface layer 4 disposed on the transparent layer 3. This layered package is coated with a resist layer 5 and then exposed optically or by means of some other method, such as electron beam, UV or X-ray lithography, through a mask 6. The thus-structured resist 5 acts as a mask for etching of the reflective surface layer 4, as shown in FIG. 2b. The structured, reflective surface layer 4 acts as a mask for etching the spacer layer 3 in a further etching step not shown. In this final etching step, the lower, reflective, continuous layer 2 acts as an etch stop layer.

As a result of the structuring of the transparent spacer layer 3, surprisingly, an especially good diffraction property of the phase grating is attained, and at the same time the advantage of a low-strain construction is attained, which has an especially advantageous effect when the phase grating is used in interferential position measuring instruments, of the kind described for instance in European Patent Publication No. EP 0 387 520 B1. The diffraction properties are better than phase gratings formed with relief structures coated with reflective materials over their entire surface. The reason for this is the precisely attainable structural accuracy in the phase grating of the present invention, because the further thin, reflective surface layer 4 is located exclusively on the surfaces of the structured spacer layer 3 that extend parallel to the continuous reflective layer 2. The edges extending at right angles to the surface of the layer 4 have a transparent effect, and so the index of refraction varies at these edges compared with the surrounding medium. A particular advantage is also that the step height h of the lands is determined solely by the deposition of the layers 3 and 4, and not by the etching process. The use of dielectric materials for the spacer layer 3 has the advantage that this material is more easily etched than the reflective layers 2 and 4, so that even relatively thick spacer layers 3 with structures in the sub-millimeter range can be etched with high edge steepness and structural precision. The spacer layer 3 has a thickness preferably that is a multiple of the thickness of the reflective surface layer 4. The reason for the good optical properties of the phase grating of the present invention with a transparent spacer layer 3 is also that the thin reflective layer 4 allows a tiny portion of the arriving light to pass through, and this portion is reflected at the lower reflective layer 2. The good diffraction properties of the phase grating of the present invention are attained by means of the spacer layer 3 in the land region, the reflective layer 2 in the land and gap region, and the different index of refraction of the land and the gap.

Instead of utilizing the process illustrated in FIGS. 2a and 2b, the phase grating can also be made using the lift-off technique. To that end, the substrate 1 is coated with the lowermost, continuous reflection layer 2, the transparent, continuous spacer layer 3, and with a resist layer 5. The resist layer 5 is exposed through a mask 6 optically or by means of other methods, such as electron beam, X-ray or UV lithography and structured, i.e., etched. This is followed by coating with the reflective surface layer 4, which is deposited onto the land regions of the structured resist layer 5 and into the gaps of the resist layer 5 on the spacer layer 3. After that, the resist 5 is detached, along with the reflective material 4 located on it. The final step is the etching of the spacer layer 3 where the reflective regions 2 act as a mask, and the reflective layer 4 serves as an etch stop layer.

In alternate embodiments other easily etchable materials such as titanium nitride (TiN) or in particular nonreflective metals can also be used for the spacer layer 3. The reflection layer 2 can also be dispensed with as a separate coating, if a highly reflective substrate is used. For that purpose, a polished steel band could for example be used as the substrate.

It is to be understood that the forms of the invention described herewith are to be taken as preferred examples and that various changes in the shape, size and arrangement of parts may be resorted to, without departing from the spirit of the invention or scope of the claims.

What is claimed is:

1. A phase grating for a photoelectric position measuring instrument, comprising:
    a substrate;
    a first reflective layer disposed over an entire surface of the substrate;
    a transparent spacer layer disposed on the first reflective layer; and
    a second reflective layer disposed on the spacer layer wherein the second reflective layer is spaced apart from and extends parallel with the first reflective layer, the second reflective layer forming an amplitude grating wherein the spacer layer is provided solely between the first and second reflective layer, the spacer layer forming lands which have edges that are not covered with the second reflective layer extending perpendicularly to the first and second reflective layers wherein the index of refraction is different on either side of the edges.

2. A phase grating according to claim 1, wherein the spacer layer has a thickness which is a multiple of the thickness of the reflection layer.

3. A phase grating according to claim 2, wherein the spacer layer has a thickness of from about 50 to about 200 nm and the reflection layer has a thickness of from about 10 to about 100 nm.

4. A phase grating according to claim 1, wherein the spacer layer comprises a dielectric material.

5. A phase grating according to claim 4, wherein the spacer layer comprises silicon dioxide.

6. A phase grating according to claim 1, wherein the first and second reflection layers comprise chromium.

7. A phase grating according to claim 1, wherein the reflection layer is applied to the substrate which has a lower coefficient of expansion.

8. A phase grating according to claim 7 wherein the substrate comprises ZERODUR.

9. A phase grating according to claim 1 wherein the phase grating is the scale of an interferential position measuring instrument, in which a beam of light is aimed at the phase grating, is diffracted there into a plurality of partial beams, and the interference of these partial beams generates position-dependent scanning signals.

10. A phase grating according to claim 1 wherein the substrate comprises a reflective material and the full surface continuous layer is formed by a surface of the substrate itself.

11. A method for producing a phase grating, the method comprising the steps of:
    depositing a first continuous reflection layer onto a substrate;
    depositing a uniformly thick spacer layer over the entire surface of the first continuous reflection layer;
    depositing a uniformly thick second reflection layer over the entire surface of the spacer layer;
    depositing a resist layer on the reflection layer;
    placing a mask over the resist layer and exposing the unmasked regions of the resist layer to light and etching away the unmasked regions of the resist layer;
    etching away the second reflection layer not coated with the resist layer;
    etching away the spacer layer in the regions not coated with the second reflective layer to create lands which have edges that are not covered with the second reflection layer; and
    removing the resist layer.

* * * * *

UNITED STATES PATENT AND TRADEMARK OFFICE
CERTIFICATE OF CORRECTION

PATENT NO. : 5,786,931
DATED : July 28, 1998
INVENTOR(S) : Speckbacher et al.

It is certified that error appears in the above-identified patent and that said Letters Patent is hereby corrected as shown below:

On the Title Page

In column 1, item [73], please insert --Dr.--, before "Johannes".

Signed and Sealed this

Twenty-seventh Day of March, 2001

Attest:

NICHOLAS P. GODICI

Attesting Officer

Acting Director of the United States Patent and Trademark Office